(12) United States Patent
Hung et al.

(10) Patent No.: US 12,068,282 B2
(45) Date of Patent: Aug. 20, 2024

(54) HYBRID METALLIC STRUCTURES IN STACKED SEMICONDUCTOR DEVICES AND ASSOCIATED SYSTEMS AND METHODS

(71) Applicant: Micron Technology, Inc., Boise, ID (US)

(72) Inventors: Tzu Ching Hung, Taichung (TW); Chien Wen Huang, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/405,673

(22) Filed: Aug. 18, 2021

(65) Prior Publication Data

US 2023/0055854 A1  Feb. 23, 2023

(51) Int. Cl.
*H01L 25/065* (2023.01)
*H01L 21/768* (2006.01)
*H01L 23/00* (2006.01)
*H01L 23/538* (2006.01)

(52) U.S. Cl.
CPC .... *H01L 25/0657* (2013.01); *H01L 21/76877* (2013.01); *H01L 23/5384* (2013.01);
(Continued)

(58) Field of Classification Search
CPC ............. H01L 24/73; H01L 25/0657; H01L 2225/06503; H01L 2225/06513;
(Continued)

(56) References Cited

U.S. PATENT DOCUMENTS

2005/0173796 A1* 8/2005 Pflughaupt ............. H01L 23/50
                                                             257/E23.079
2005/0194695 A1* 9/2005 Lin ..................... H01L 25/0657
                                                             257/E21.705
(Continued)

FOREIGN PATENT DOCUMENTS

EP        3828922 A1    6/2021
JP   2015226046 A  * 12/2015 ............. H01L 24/81
(Continued)

OTHER PUBLICATIONS

Translation of Yasukawa, JP-2015226046-A, 2015 (Year: 2015).*
(Continued)

*Primary Examiner* — Nicholas J Tobergte
*Assistant Examiner* — William Henry Anderson
(74) *Attorney, Agent, or Firm* — Perkins Coie LLP

(57) ABSTRACT

A stacked semiconductor device having hybrid metallic structures and associated systems and methods are disclosed herein. The stacked semiconductor device can include a first semiconductor die and a second semiconductor die. The first semiconductor die can include a top surface, a first bond site at the top surface and a second bond site at the first surface spaced apart from the first bond site. The second semiconductor die can include a lower surface facing the top surface of the first semiconductor die, a third bond site at the lower surface, and a fourth bond site at the lower surface. The third bond site includes a conductive structure bonded to the first bond site by a metal-metal bond. The fourth bond site at the lower surface includes a solder ball bonded to the second bond site.

11 Claims, 11 Drawing Sheets

(52) U.S. Cl.
CPC .......... *H01L 23/5386* (2013.01); *H01L 24/11* (2013.01); *H01L 24/14* (2013.01); *H01L 24/73* (2013.01)

(58) Field of Classification Search
CPC ......... H01L 2225/06541; H01L 23/481; H01L 21/76877; H01L 21/76883; H01L 23/5384; H01L 21/187; H01L 2224/80894; H01L 2224/80895; H01L 2224/81894; H01L 2224/81895; H01L 2224/82895; H01L 2224/82896; H01L 2224/83894; H01L 2224/83895; H01L 2224/8583; H01L 2224/02123–02126; H01L 2224/0214–02165; H01L 2224/0218–0219; H01L 2224/10122–10126; H01L 2224/11011; H01L 2224/11019; H01L 2224/80007; H01L 2224/81007; H01L 2224/82007; H01L 2224/83007
See application file for complete search history.

(56) References Cited

U.S. PATENT DOCUMENTS

| | | |
|---|---|---|
| 2010/0129960 A1 | 5/2010 | Mejima et al. |
| 2016/0343655 A1 | 11/2016 | Majeed et al. |
| 2017/0025387 A1* | 1/2017 | Ichikawa ................. H01L 24/94 |
| 2018/0247915 A1* | 8/2018 | Kinsley ............... H01L 25/0657 |
| 2019/0139908 A1 | 5/2019 | Shima et al. |
| 2021/0159207 A1* | 5/2021 | Derakhshandeh ...... H01L 24/06 |
| 2022/0068886 A1* | 3/2022 | Chung .................... H01L 24/13 |
| 2023/0133322 A1* | 5/2023 | Kim ........................ H01L 24/48 257/737 |

FOREIGN PATENT DOCUMENTS

| | | |
|---|---|---|
| JP | 2015226046 A | 12/2015 |
| TW | 200905843 A | 2/2009 |
| TW | 201843782 A | 12/2018 |

OTHER PUBLICATIONS

TW Patent Application No. 111125679—Taiwanese Office Action and Search Report, issued Jun. 20, 2023, with English Translation, 22 pages.

TW Patent Application No. 111125679—Taiwanese Office Action, issued Oct. 26, 2023, with English Translation, 17 pages.

\* cited by examiner

HYBRID METALLIC STRUCTURES IN STACKED SEMICONDUCTOR DEVICES AND ASSOCIATED SYSTEMS AND METHODS

TECHNICAL FIELD

The present disclosure is generally related to systems and methods for stacked semiconductor devices. In particular, the present technology relates to stacked semiconductor devices having hybrid metallic structures bonding dies in stacked semiconductor devices.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies and yet increase the capacity and/or speed of the resulting semiconductor assemblies. To meet these demands, semiconductor die manufacturers often stack multiple semiconductor dies vertically on top of each other to increase the capacity or performance of a microelectronic device within the limited area on a circuit board or other element to which the semiconductor dies and/or assemblies are mounted.

Further, semiconductor die manufacturers have continually reduced the bond line thickness to reduce the overall height of the stack of semiconductor dies and/or reduced the pitch between bonding features to reduce the longitudinal footprint of the die stacks. However, the reductions can cause problems with the bonds between the dies. For example, traditional solder bonds between the semiconductor die stacks often have squeezed-out portions. As the height requirements shrink, the dies are compressed together, resulting in more squeeze-out that can form thermal and/or electrical shorts between bonding features. Reductions in the pitch between bonding features can also cause the squeezed-out portions to form shorts between bonding features.

Figure 1:
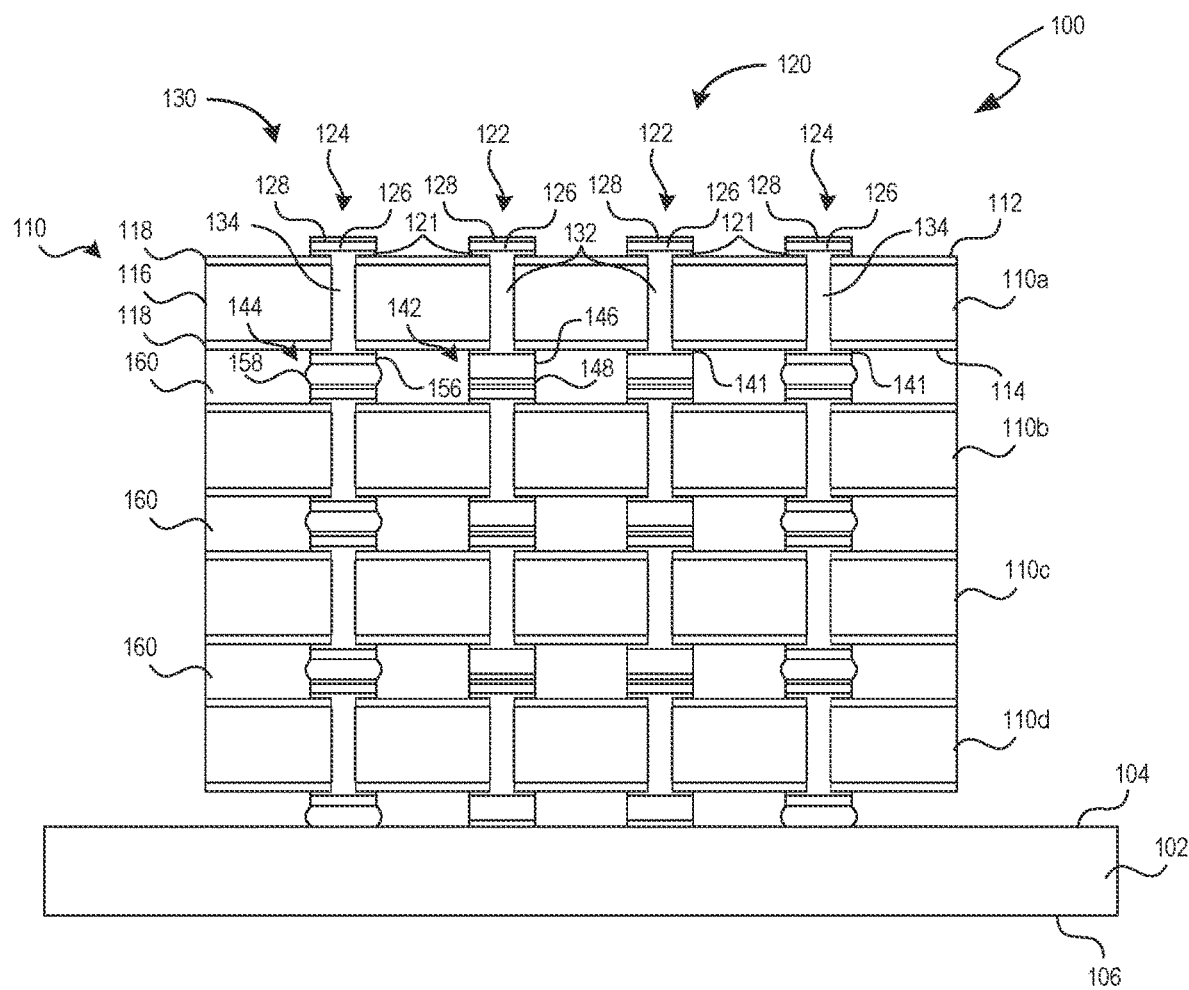
FIG. 1 is a cross-sectional view of a stacked semiconductor device having hybrid metallic bonding structures between dies in accordance with some embodiments of the present technology.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below.

DETAILED DESCRIPTION

Overview

A stacked semiconductor device having hybrid metallic structures, and associated systems and methods, are disclosed herein. The stacked semiconductor device includes a first semiconductor die and a second semiconductor die. The first semiconductor die has a top surface and a bottom surface opposite the top surface. One or more first bond sites are positioned on the top surface. One or more second bond site are positioned at the top surface spaced apart from the first bond sites. The second semiconductor die includes a lower surface facing the top surface of the first semiconductor die. One or more third bond sites are positioned at the lower surface corresponding to the first bond sites. One or more fourth bond sites are positioned at the lower surface corresponding to the second bond sites. The third bond sites include a conductive structure bonded to the first bond site through a metal-metal bond. The fourth bond sites include a solder structure (e.g., a solder ball, solder pillar, and the like) bonded to the second bond site (e.g., using traditional solder-bond techniques). That is, the stacked semiconductor device has a hybrid bonding scheme that includes one or more metal-metal bonds (e.g., metal-metal joints, sometimes also referred to herein as "solder free" bonds) and one or more solder bonds (e.g. solder joints) between bond sites on the stacked semiconductor dies. The hybrid bonding scheme can utilize the benefits of solder bonds (e.g., self-alignment, cost, etc.) while minimizing the disadvantages of the solder bonds (e.g., risk of shorts between bond sites). Further, the hybrid bonding scheme can utilize the benefits of metal-metal bonds (quality connections, low risk of shorts) while addressing the limitations of the metal-metal bonds (e.g., alignment).

In some embodiments, the metal-metal bonds form a live electrical connection between the semiconductor dies, while the solder bonds form a thermal connection between thermal structures in the semiconductor dies. In some embodiments, each of first-fourth bond sites generally corresponds to a feature in the semiconductor dies (e.g., a through substrate via, redistribution layer, thermal feature, and/or any other suitable element). In some embodiments, the first and second bond sites are generally similar in structure. In some such embodiments, the first and second bond sites are formed in the same manufacturing process. For example, the first and second bond sites can be formed through the same copper deposition process. Further, in some embodiments, the metal-metal bond between the first and third bond sites is a copper-copper bond.

For ease of reference, the stacked semiconductor device and the components therein are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the stacked semiconductor device and the components therein can be moved to, and used in, different spatial orientations without changing the structure and/or function of the disclosed embodiments of the present technology.

DESCRIPTION OF THE FIGURES

FIG. 1 is a cross-sectional view of a stacked semiconductor device 100 ("device 100") with hybrid metallic structures between semiconductor dies in accordance with some embodiments of the present technology. In the illustrated embodiment, the device 100 includes a package substrate 102 with a first surface 104 (e.g., an upper surface or die stacking surface) and a second surface 106 (e.g., a lower surface) opposite the first surface 104. Semiconductor dies 110 ("dies 110," referred to individually as first-fourth dies 110a-d) are stacked on the first surface 104 of the package substrate 102, and a molding compound is disposed between each of the dies 110 as well as between the fourth die 110d (e.g., a lowermost die) and the package substrate 102.

As illustrated in reference to the first die 110a (e.g., an uppermost die), each of the dies 110 has a first surface 112 (e.g., an upper or top surface) and a second surface 114 (e.g., a lower or bottom surface). Each of the dies 110 can include a main semiconductor substrate 116 insulated by a dielectric substrate 118 at the first and second surfaces 112, 114. The first die 110a includes a first array of bond sites 120a carried by the first surface 112, an array of through substrate vias 130 ("TSVs 130") extending at least partially through the first die 110a, and a second array of bond sites 120b carried by the second surface 114. In the illustrated embodiment, the TSVs 130 extend fully through the first die 110a; each individual bond site in the first array of bond sites 120a is directly coupled to an individual TSV 130; and each individual bond site in the second array of bond sites 120b is directly coupled to an individual TSV 130. In various other embodiments, one or more of the TSVs 130 can extend only partly through the first die 110a, one or more bond sites in the first array of bond sites 120a can be coupled to another structure on the first surface 112 (e.g., to a trace in a redistribution layer, a thermal element, or another suitable structure), and/or one or more bond sites in the second array of bond sites 120b can be coupled to another structure on the second surface 114.

As further illustrated in FIG. 1, the first array of bond sites 120a includes one or more first bond sites 122 (two shown) and one or more second bond sites 124 (two shown) spaced apart from the first bond sites 122. In the illustrated embodiment, the first and second bond sites 122, 124 are generally similar in structure. For example, as illustrated, the first and second bond sites 122, 124 can each have a bonding structure that includes a conductive pad 121 bonded to first and second TSVs 132, 134 at the first surface 112, a metallic pad 126 carried by the conductive pad 121, and a bonding film 128 carried by the metallic pad 126.

In various embodiments, the conductive pad 121 can be formed from a suitable conductive metal such as copper, gold, silver, aluminum, or any other suitable conductive materials. Similarly, in various embodiments, the metallic pad 126 can be formed from a suitable conductive metal such as copper, gold, silver, aluminum, or any other suitable conductive materials. Similarly, in various embodiments, the bonding film 128 can be formed from a suitable conductive metal such as copper, gold, silver, aluminum, or any other suitable conductive materials. In various embodiments, the conductive pad 121, the metallic pad 126, and the bonding film 128 can be formed from the same conductive material and/or different conductive materials. For example, in some embodiments, the conductive pad 121 and the metallic pad 126 are formed from copper while the bonding film 128 is formed from gold. The copper construction of the conductive pad 121 and the metallic pad 126 can help reduce manufacturing costs, while the gold construction of the bonding film 128 can help improve the bonding ability of the surface of the first bond site 122.

The second array of bond sites 120b includes one or more first bond sites 142 (two shown) and one or more second bond sites 144 (two shown) spaced apart from the first bond sites 142. In the illustrated embodiment, the first bond sites 142 have a generally different structure than the second bond sites 144. As illustrated, the first bond sites 142 have a structure generally similar to the first bond sites 122 discussed above. For example, the first bond sites 142 include a conductive pad 141 bonded to the first TSV 132 at the second surface 114, a metallic pad 146 carried by the conductive pad 141, and a bonding film 148 carried by the metallic pad 146. As also discussed above, in various embodiments, the conductive pad 141, the metallic pad 146, and/or the bonding film 148 can be formed from a suitable conductive metal such as copper, gold, silver, aluminum, or any other suitable conductive materials. For example, in some embodiments, the conductive pad 141 and the metallic pad 146 are formed from copper while the bonding film 148 is formed from gold.

In some embodiments, each of the metallic pads 126, 146 are formed from a sufficiently refined metallic material to allow the metallic pads 126, 146 to bond directly to each other. For example, in some embodiments, each of the metallic pads 126, 146 are formed from copper with bonding surfaces that are relatively free (or free) from defects. In such embodiments, the bonding films 128, 148 can be omitted and the copper in the metallic pads 126, 146 can be directly bonded in a metal-metal bond.

The second bond sites 144, however, have a structure generally different from the second bond sites 124. In the illustrated embodiment, the second bond sites 144 include the conductive pad 141 bonded to the second TSV 134, a metallic pad 156 carried by the conductive pad 141, and a solder structure 158 carried by the metallic pad 156. The conductive pad 141 and/or the metallic pad 156 can be formed from a suitable conductive metal such as copper, gold, silver, aluminum, or any other suitable conductive materials. The solder structure can be a solder ball, column of solder material, or any other suitable structure.

As further illustrated in FIG. 1, each of the second-fourth dies 110b-c includes the first array of bond sites 120a and the second array of bond sites 120b. At each bonding interface in the device 100, the first array of bond sites 120a of a relatively inferior die is bonded to the second array of bond sites 120b of a relatively superior die. For example, as illustrated with respect to the first and second dies 110a, 110b, the first array of bond sites 120a on the second die 110b is bonded to the second array of bond sites 120b the first die 110a. In particular, the first bond sites 122 on the second die 110b are bonded to the first bond sites 142 of the first die 110a through a metal-metal bond between the bonding films 128, 148 while the second bond sites 124 on the second die 110b are bonded to the second bond sites 144 of the first die 110a through a solder bond between the bonding film 128 and the solder structure 158.

During the bonding process, the solder bonding process between the second bond sites 124, 144 can help align the first and second dies 110a, 110b (e.g., through the solder self-alignment process). However, the bonding process squeezes the solder structure 158, which drifts outwards in an x-y plane towards the other bond sites. If each of the bonds in the device 100 are solder bonds, the bond sites must be separated by at least twice the distance of the drift to avoid shorts between the bond sites. As the height requirements for the devices of the type illustrated in FIG. 1 shrink, the dies 110 in the stack are compressed closer together, which can increase the average distance that the solder structure 158 drifts. Further, it can be desirable to reduce the distance between bonds sites (e.g., decreasing pitch) to reduce the x-y footprint of the device 100 and/or provide additional communication lines between the dies 110. As a result of the height and pitch reductions, the solder squeezed out between bond sites can form shorts between the bond sites, thereby compromising the performance of the device 100. The metal-metal bond between the first bond sites 122, 142 does not have the same squeeze-out concern for forming shorts between the bond sites, and the metal-metal bond can provide a high quality connection between the bond sites. However, the metal-metal bonds are not suitable for bond sites with a above pitch of 5 micrometers (μm), for example due to high costs in aligning the bond sites.

The hybrid construction of the first and second bond sites 142, 144 and the hybrid bonding scheme in the device 100 reduces the chance of a bridge forming between bond sites while maintaining many benefits of the solder-bond. For example, as discussed in more detail below with respect to FIGS. 4A-4D, the second bonds sites 124, 144 can be bonded first to align the first and second dies 110a, 110b, then the metal-metal bonds can be formed between the first bond sites 122, 142. Further, the hybrid bonding scheme can take advantage of the benefits of the metal-metal bond between the first bond sites 122, 142. For example, in some embodiments, the first TSVs 132 are electrical communication channels (e.g., live TSVs) between the dies 110 while the second TSVs 134 form thermal communication channels (e.g., heat dissipation routes) between the dies 110. The metal-metal bond can help ensure a quality electrical connection between the dies 110, while the solder bonds can help ensure the dies 110 are accurately aligned.

The hybrid bonding scheme in the device 100 can be especially advantageous when the pillar pitch and/or the bond line thickness are small enough that the pure solder bonding scheme begins to form too many shorts. In various embodiments, for example, the hybrid metallic bonding structures can be used when the pillar pitch is above about 3 μm, between about 60 μm and about 4 μm, or between about 40 μm and about 5 μm. In some embodiments, the hybrid metallic bonding structures can be used when the bond line thickness between the dies 110 is between about 1 μm and 30 μm, between about 2 μm and about 25 μm, between about 5 μm and about 20 μm, or between about 10 μm and about 20 μm.

FIGS. 2A-2J illustrate a process for producing the bond sites on a semiconductor die 110 in accordance with some embodiments of the present technology. The process described below with respect to FIGS. 2A-2J can be used, for example, to produce the hybrid conductive structures in the second array of bond sites 120b discussed above with respect to FIG. 1. Further, the process described below can begin after the dielectric substrate 118 (FIG. 1) has been deposited on the second surface 114 and a conductive layer 121' (e.g., a precursor to the conductive pads 121) has been deposited on the dielectric substrate 118.

Figure 2A:
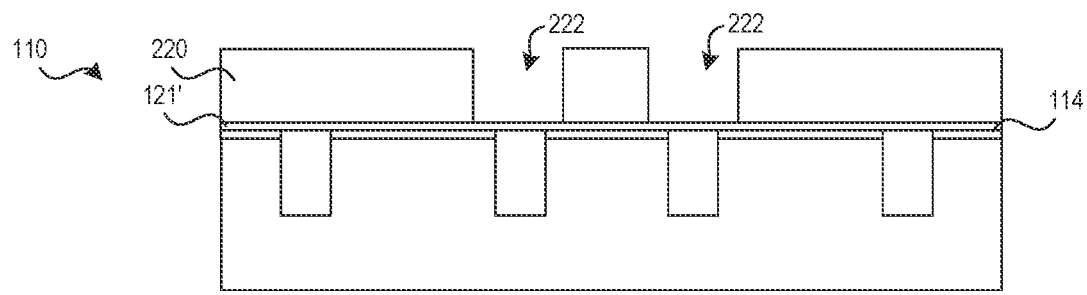
FIGS. 2A-2J illustrate a process for producing a semiconductor die with hybrid metallic bonding structures for use in a stacked semiconductor device accordance with some embodiments of the present technology.

FIG. 2A illustrates the die 110 after depositing and patterning a photoresist material 220 on the second surface 114 of the die 110. As illustrated, patterning the photoresist material 220 can form vias 222 in the photoresist material 220 that expose the conductive layer 121' over one or more TSVs 130 in the die 110. In some embodiments, the vias 222 expose the TSVs 130 corresponding to live communication channels through the die 110.

Figure 2B:
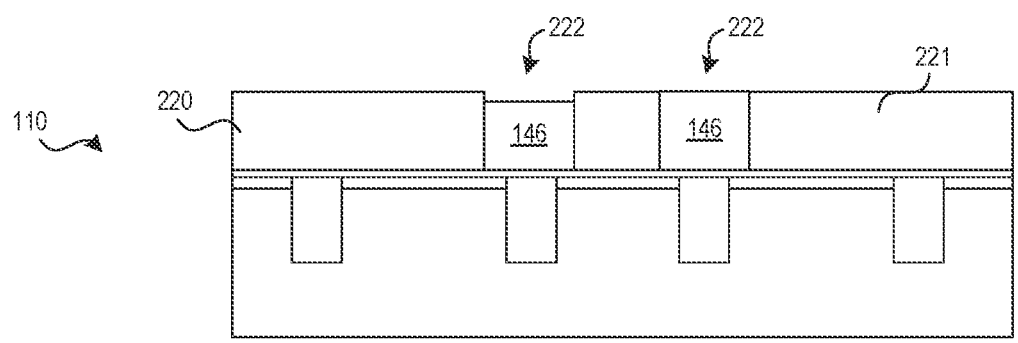

FIG. 2B illustrates the die 110 after metal plating the one or more vias 222 to form one or more instances of the metallic pad 146. As illustrated in FIG. 2B, each of the vias 222 can be filled to a level at or near an upper surface 221 of the photoresist material 220 by the metal plating process. As further illustrated in FIG. 2B, the metallic pads 146 can have dissimilar heights after the metal plating process.

Figure 2C:
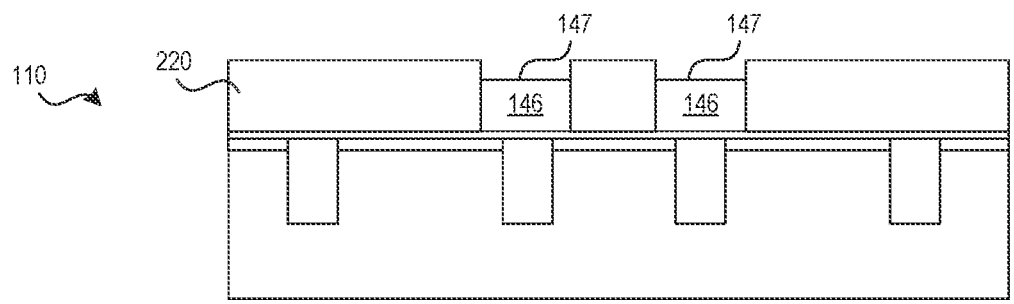

FIG. 2C illustrates the die 110 after removing material from an upper surface 147 of each of the metallic pads 146. As discussed in more detail below with respect to FIGS. 5A and 5B, the removal process can ensure that the metallic pads 146 have a generally uniform height and/or that the upper surface 147 is relatively free from defects.

Figure 2D:
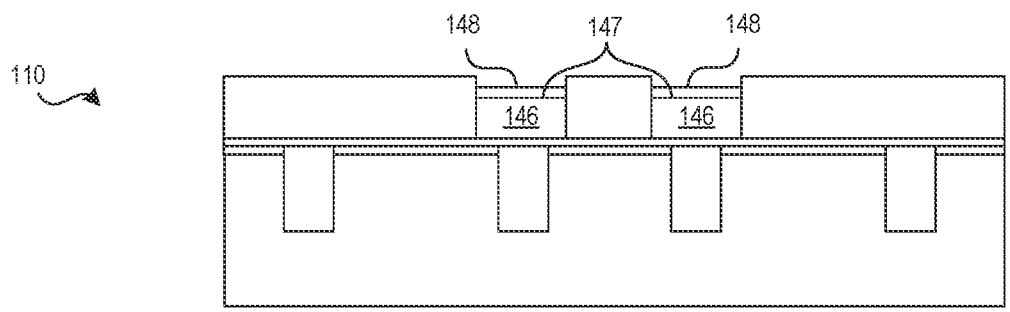

FIG. 2D illustrates the die 110 after a metal plating process on the upper surface 147 of the metallic pads 146 to deposit the bonding film 148. In some embodiments, the bonding film 148 can protect the metallic pads 146 during further processing of the die 110, thereby preventing reintroduction of impurities in the upper surface 147. In some embodiments, the bonding film 148 can be a conductive metal selected based at least in part on the metal's ability to form the metal-metal bonds discussed above with respect to FIG. 1. For example, in some embodiments, the bonding film 148 is a layer of gold.

As discussed above, in some embodiments, the bonding film 148 is omitted. In such embodiments, the process for producing the first array of bond sites can omit the second metal plating process of FIG. 2D. For example, in some embodiments, the metallic pads 146 can have a sufficiently uniform upper surface 147 and/or be composed of a suitable metal for forming the metal-metal bonds to omit the second deposition process.

Further, in some embodiments, the process for producing the first array of bond sites can omit the removal process discussed above with respect to FIG. 2C. For example, in some embodiments, the deposition process discussed above with respect to FIG. 2B can create metallic pads 146 with heights within an acceptable tolerance range, such that the removal process is unnecessary. In another example, the second deposition process of FIG. 2D can account for differences in the height.

Figure 2E:
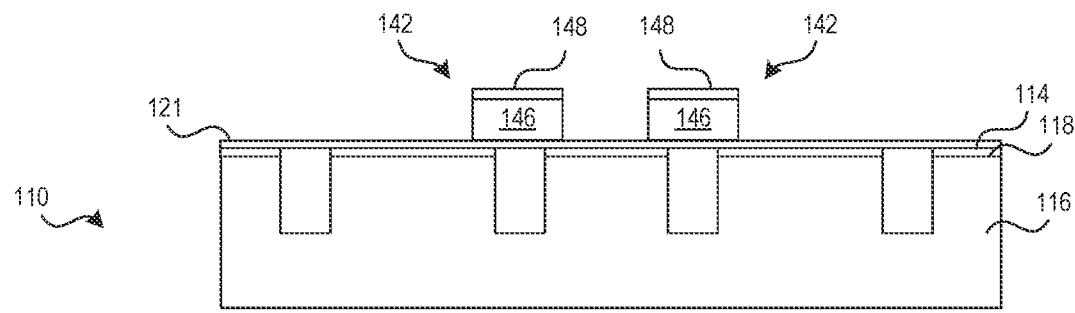

FIG. 2E illustrates the die 110 after depositing the bonding film 148 on the metallic pads 146 to complete the formation of the conductive structures at the first bond sites 142. Once the conductive structures are completed, the photoresist material 220 can be stripped from the die 110.

Figure 2F:
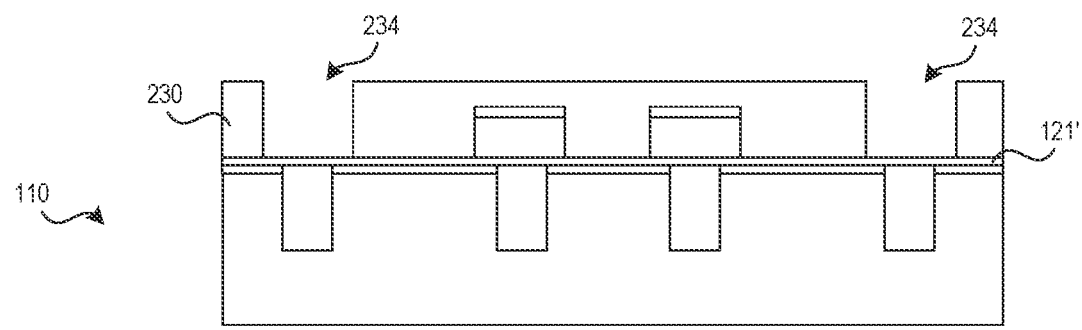

FIG. 2F illustrates the die 110 after depositing and patterning a second photoresist material 230 on the second surface 114 of the die 110. As illustrated, patterning the second photoresist material 230 forms vias 234 that expose the conductive layer 121' over one or more TSVs 130 in the die 110. In some embodiments, the vias 234 in the photoresist material expose the TSVs 130 corresponding to thermal channels through the die 110.

Figure 2G:
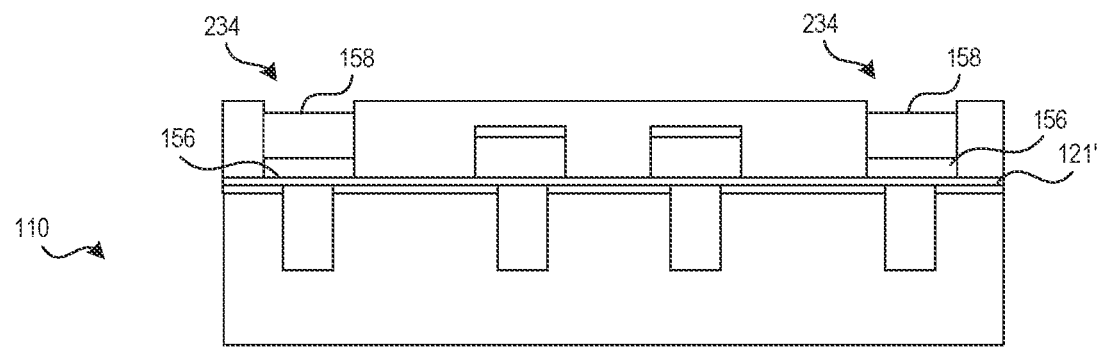

FIG. 2G illustrates the die 110 after a metal and solder plating processes to deposit the metallic pad 156 and the solder structure 158 in succession. As illustrated, the resulting solder pads may have varying heights, but each has a rectangular structure bonded to the metallic pad 156.

Figure 2H:
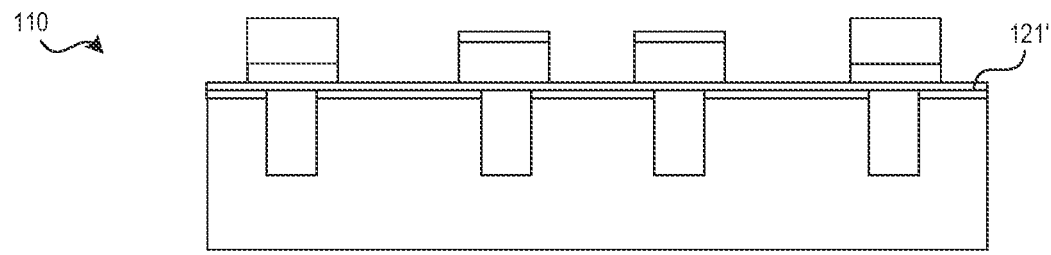
Figure 2I:
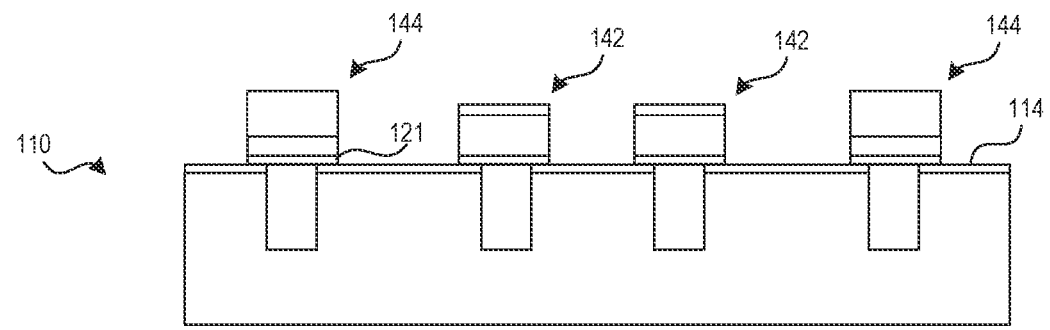

FIG. 2H illustrates the die 110 after stripping the second photoresist material 230 from the die 110. FIG. 2I illustrates the die 110 after etching the conductive layer 121' to expose the second surface 114 of the die 110 and to isolate the newly formed conductive structures. That is, the evicting process removes material from the conductive layer 121' to isolate the conductive pads 121 of the first and second bond sites 142, 144.

Figure 2J:
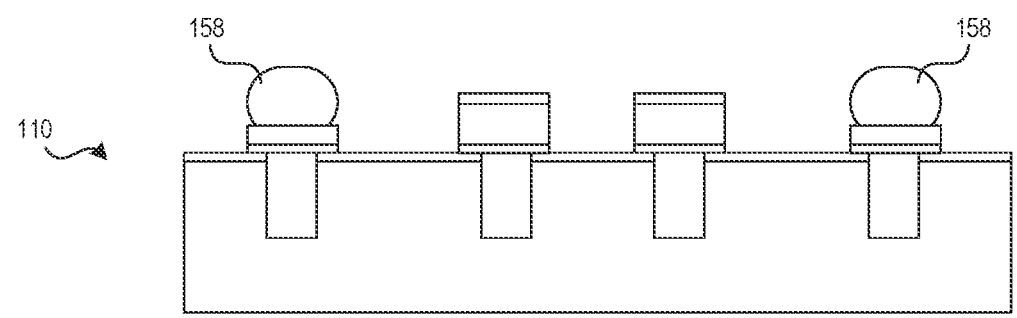

FIG. 2J illustrates the die 110 after a solder reflow process to reshape the solder structures 158. In some embodiments, the solder reflow process can improve the bond between the metallic pad 156 and the solder structure 158. In some embodiments, the solder reflow process can improve the uniformity of the height of the solder structures 158 on the die 110.

FIGS. 3A-3H illustrate a process for producing an array of generally similar bond sites on a semiconductor die 110 in accordance with some embodiments of the present technology. The process described below with respect to FIGS. 3A-3H can be used, for example, to produce the first array of bond sites 120a discussed above with respect to FIG. 1. In the illustrated embodiment, the process of FIGS. 3A-3H occurs after the process discussed above with respect to FIGS. 2A-2J. In other embodiments, the process of FIGS. 3A-3H occurs before forming the hybrid conductive structures of the second array of bond sites 120b.

Figure 3A:
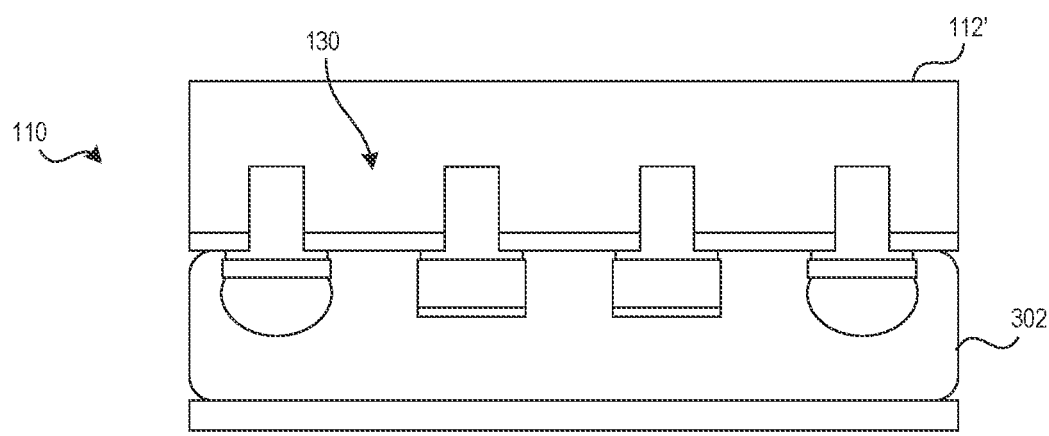
FIGS. 3A-3H illustrate a process for producing a semiconductor die with corresponding metallic bonding structures for use in a stacked semiconductor device accordance with some embodiments of the present technology.

Referring to FIG. 3A, the process can begin by securing the die 110 on a carrying structure 302, such as a carrying wafer. In some embodiments, the carrying wafer includes a protective material 304 (e.g., a molding material) that contours to the conductive structures in the second array of bond sites 120b. Once mounted, an unprocessed first surface 112' of the die 110 can be processed to expose the TSVs 130 in the die 110.

Figure 3B:
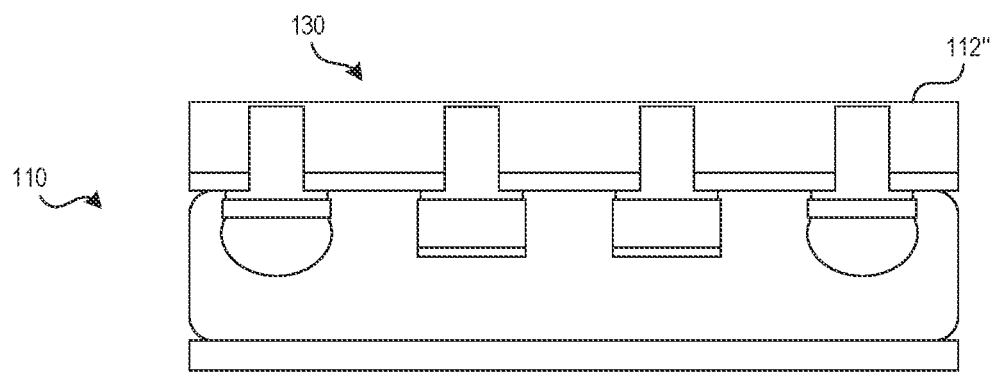

FIG. 3B illustrates the die 110 after a bulk removal and/or thinning process on the first surface 112' that completes with the first surface 112" at an elevation above the TSVs 130. In various embodiments, the bulk thinning process can include a grinding process and/or a chemical-mechanical planarization (CMP) process to remove semiconductor substrate 116 material from the first surface 112" quickly and/or efficiently.

Figure 3C:
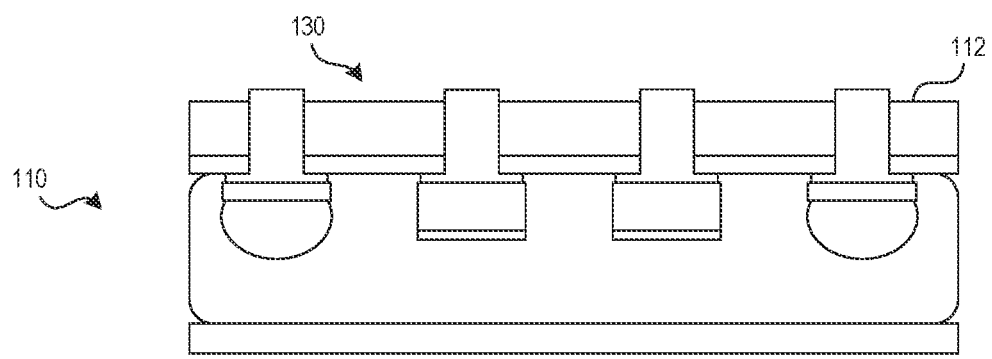

FIG. 3C illustrates the die 110 after a second removal and/or thinning process resulting in the first surface 112 at an elevation parallel to or just below the TSVs 130. In some embodiments, the second removal process is a dry etching process to carefully remove semiconductor substrate 116 material while minimizing damage to and/or removal from the TSVs 130.

Figure 3D:
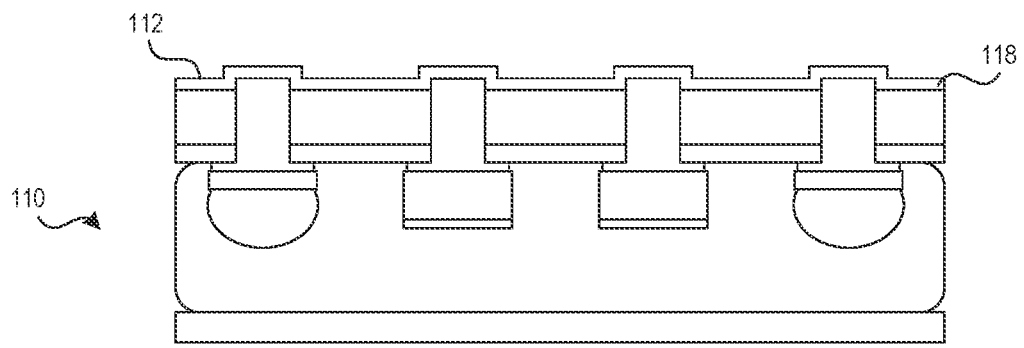

FIG. 3D illustrates the die 110 after depositing a dielectric layer 118 (and/or a passivation layer) on the first surface 112 of the die 110, for example by a chemical vapor deposition process. As illustrated in FIG. 3D, the deposition process can result in the dielectric layer 118 the recently exposed ends of the TSVs 130.

Figure 3E:
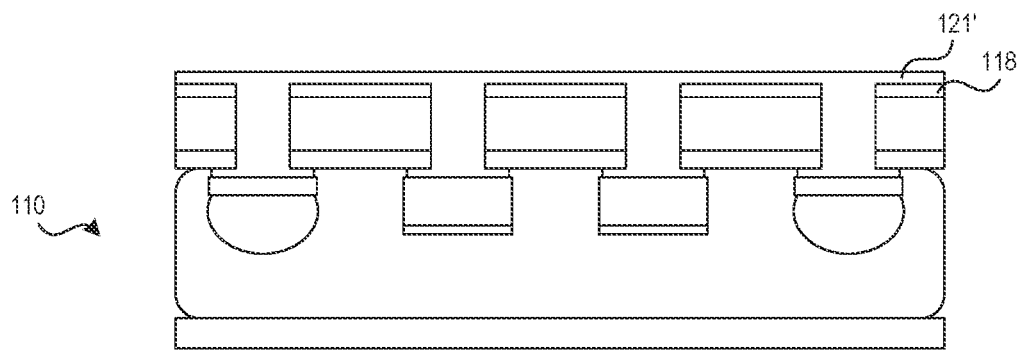

FIG. 3E illustrates the die 110 after an optional removal process that re-exposes the TSVs 130 in the die 110 and a deposition process to deposit a conductive layer 121'. In various embodiments, the optional removal process can include a CMP process, dry etching process, or other suitable removal process, resulting in the completed dielectric layer 118 on the first surface 112 of the die 110.

As further illustrated in FIG. 3E, once the TSVs 130 are exposed, a deposition process can deposit the conductive layer 121' across the first surface 112. In some embodiments, the conductive layer 121' is a metal seed layer. Examples of metals that be used in the conductive layer 121' include, copper, tin, aluminum, gold, silver, and/or any other suitable metal. In some embodiments, the conductive layer 121' is deposited by a physical vapor deposition (PVD) process.

Figure 3F:
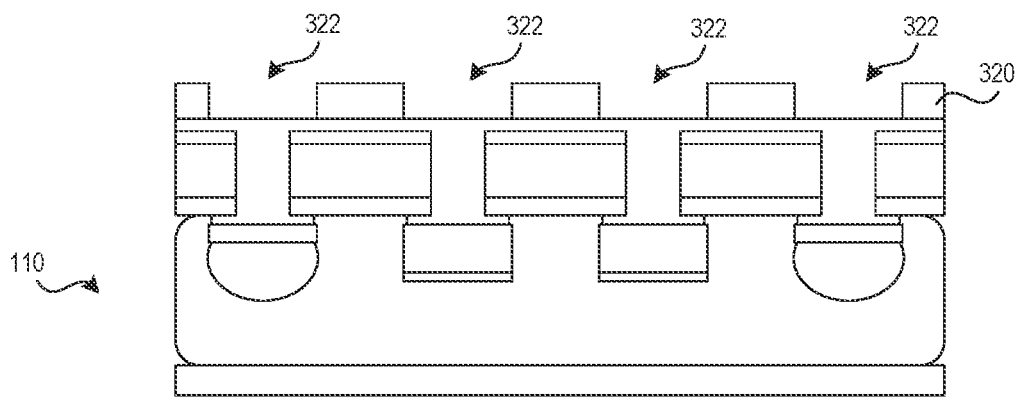

FIG. 3F illustrates the die 110 after depositing and patterning a third photoresist material 320 over the conductive layer 121'. As illustrated, the patterning can result in vias 322 that expose the conductive layer 121' in locations generally corresponding to the TSVs 130 in the die 110. In some embodiments, each of the vias 322 has a generally similar size and shape. In other embodiments, the vias 322 can have different sizes and/or shapes. For example, a first group of the vias corresponding to live communication channels through the die 110 can have a size configured to mate with the conductive structures on the first bond sites 142 (FIG. 1), while a second group of the vias corresponding to thermal channels through the die 110 can have a size configured to mate with the conductive structures on the second bond sites 144.

Figure 3G:
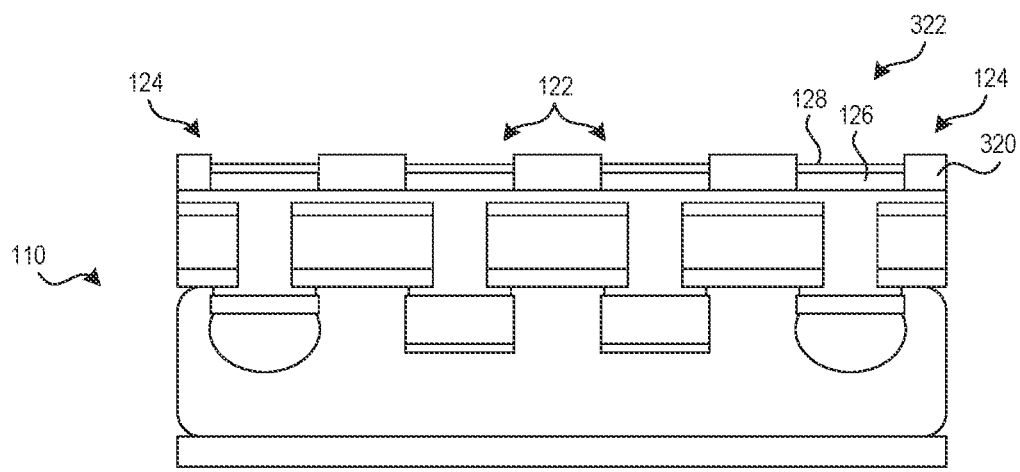

FIG. 3G illustrates the die 110 after a plating process to deposit the metallic pad 126 and the bonding film 128 in the vias 322, thereby forming the first and second bond sites 122, 124. As illustrated in FIG. 3G, the generally equivalent width of the vias 322 results in generally equivalent widths between the first bond sites 122 and the second bond sites 124. As discussed above, the first and second bond sites 122, 124 can be formed with varying widths corresponding to the widths of the first and second bond sites 142, 144 (FIG. 1) on the second surface 114 of another semiconductor die and/or another suitable substrate. In the illustrated embodiment, the plating processes also creates the first and second bond sites 122, 124 with generally uniform heights. In other embodiments, the plating processes can be tailored to create the first and second bond sites 122, 124 with varying heights to further facilitate bonds between with the corresponding bond sites. Further, the plating process can omit depositing the bonding film 128 in the metallic pads 126 associated with the first bond sites 122.

Figure 3H:
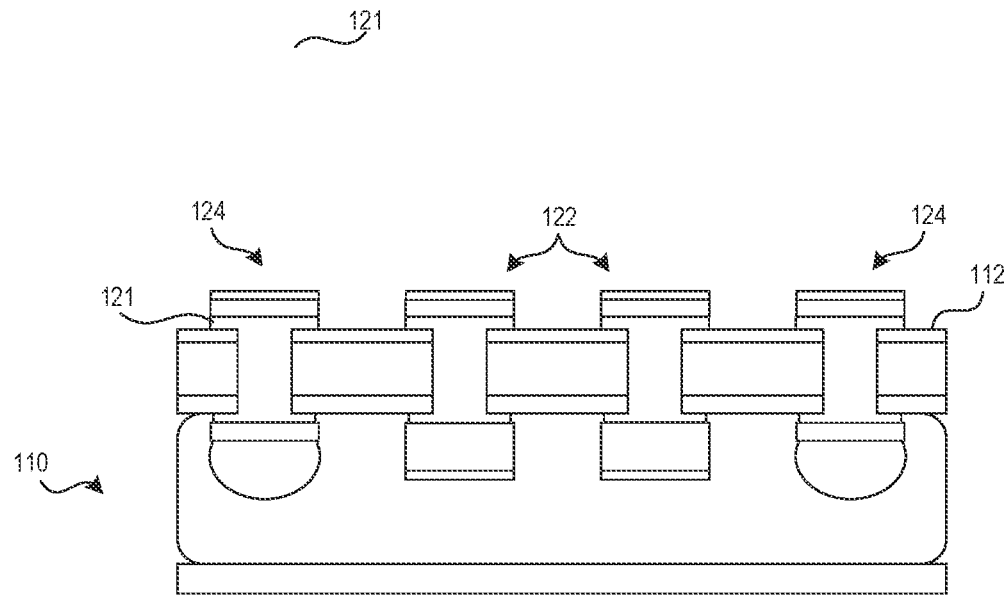

FIG. 3H illustrates the die 110 after stripping the third photoresist material 320 from the die 110 to expose the conductive layer 121'. As further illustrated, the process then includes etching the exposed conductive layer 121' to isolate the conductive pads 121 (and therefore isolate the first and second bond sites 122, 124) and to expose the first surface 112 of the die 110.

Although the processes described above with respect to FIGS. 2A-3H describe producing the hybrid conductive structures on a semiconductor die first, it will be understood that, in some embodiments, the die 110 is produced in a different order. For example, in some embodiments, the generally similar conductive structures on the first surface 112 of the die 110 are produced before producing the hybrid conductive structures on the second surface 114 of the die 110 (e.g., by swapping the processes described above with respect to FIGS. 2A-2J with the processes described above with respect to FIGS. 3F-3H).

FIGS. 4A-4D illustrate a process for forming a stacked semiconductor device having hybrid conductive structures in accordance with some embodiments of the present technology. The process described can be completed, for example, after hybrid structures are produced on the die 110 in accordance with the embodiments discussed above with respect to FIGS. 2A-3H.

Figure 4A:
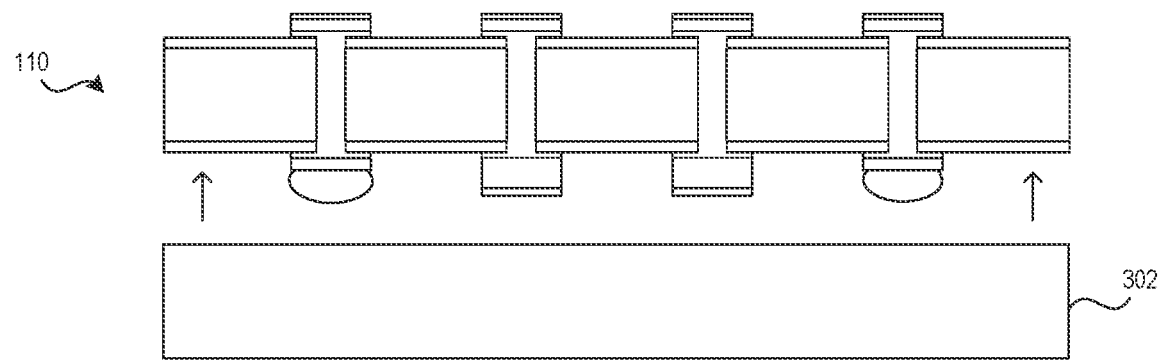
FIGS. 4A-4D illustrate a process for forming a stacked semiconductor device having hybrid metallic bonding structures in accordance with some embodiments of the present technology.

Referring to FIG. 4A, one or more dies 110 (one shown) can be lifted off the carrying structure 302. For example, the die 110 can be de-bonded from a wafer carrying substrate and/or lifted off of a molding material. In some embodiments, the process at FIG. 4A includes dicing a wafer (not shown) to singulate the dies 110 from the wafer.

Figure 4B:
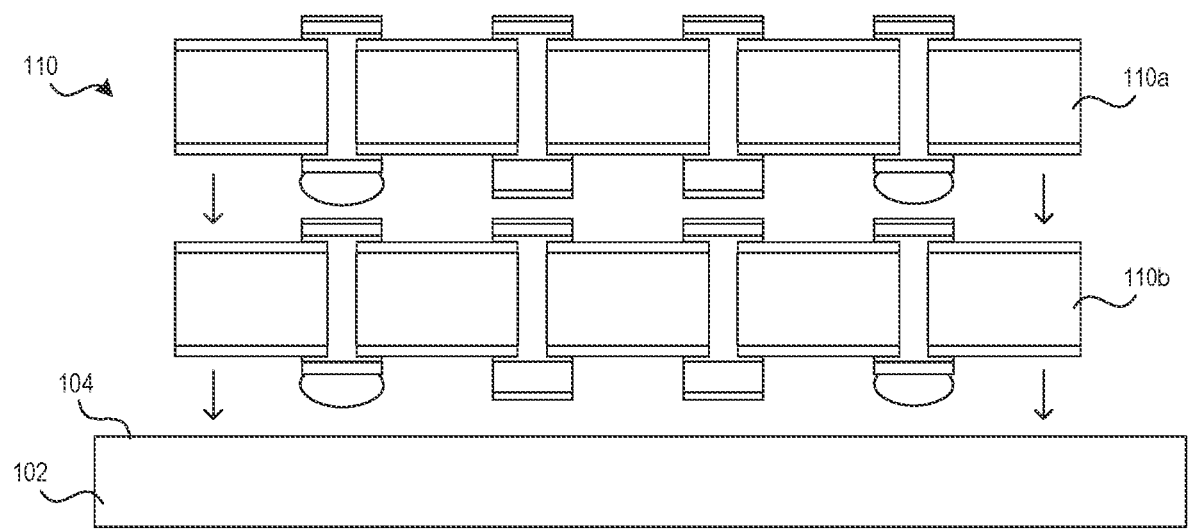

Referring to FIG. 4B, one or more dies 110 (two shown) can be stacked on top of a package substrate 102. In the illustrated embodiment, the second die 110b is stacked on an upper surface 104 of the package substrate 102, and the first die 110a is stacked on top of the second die 110b. In some embodiments, multiple dies can be stacked on various other substrates. For example, in some embodiments, one or more dies 110 can be stacked on a base die before or after the base die is attached to the package substrate 102 or any other suitable material. As illustrated in FIG. 4B, stacking the dies 110 can include generally aligning the second array of bond sites 120b on the first die 110a with the first array of bond sites 120a on the second die 110b.

Figure 4C:
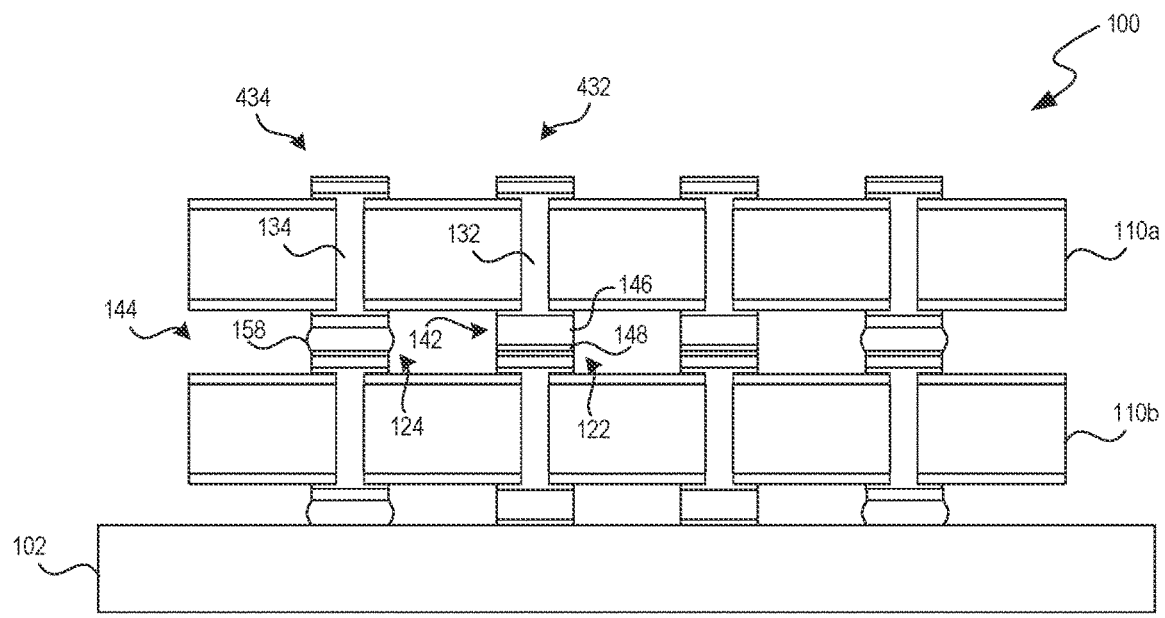

FIG. 4C illustrates the device 100 after a solder reflow process and/or a thermocompression bonding process. The solder reflow process forms a bond between the second bond sites 144 on the first die 110a and the second bond sites 124 on the second die 110b. As illustrated, the solder reflow process includes compressing the dies 110, resulting in some squeeze out on the solder structure 158 in a horizontal plane. In some embodiments, the solder reflow process establishes a thermal channel 434 through the device 100. In some embodiments, the solder reflow process further aligns the dies 110, thereby correcting any minor errors in the alignment from the stacking. The self-alignment from the solder reflow process occurs as the solder adjusts to minimize the surface area of the solder structure 158 and can adjust the position of the dies 110 accordingly.

The thermocompression bonding process (sometimes also referred to herein as an "annealing process") forms a metal-metal bond between the first bond sites 142 on the first die 110a and the first bond sites 122 on the second die 110b. The metal-metal bond that is formed can depend on the bonding films 128, 148 deposited on the first bond sites 122, 142. In some embodiments, the metal-metal bond includes a copper-copper bond, a silver-silver bond, a gold-gold bond, and/or any other suitable metal-metal bond. In some embodiments, the metal-metal bond establishes an electrical channel 432 through the device 100. In some embodiments, the thermocompression bonding process occurs concurrently with the solder reflow process. For example, in some embodiments, the thermocompression bonding process introduces enough heat to cause the solder structure 158 to reflow. In some embodiments, the thermocompression bonding process can be performed after the solder reflow process to improve the alignment between the first bond sites 122, 142 before forming the metal-metal bond.

Figure 4D:
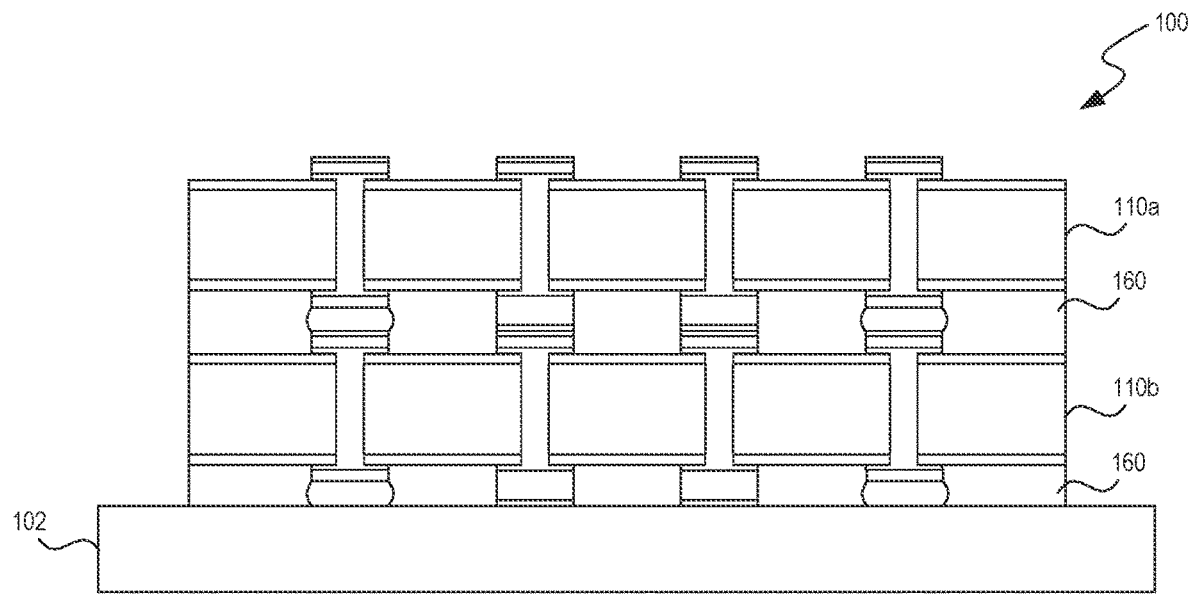

FIG. 4D illustrates the device 100 after the underfill material 160 is deposited between the first die 110a and the second die 110b as well as between the second die 110b and the package substrate 102. The underfill material 160 can be a thermoset epoxies or other suitable material. The underfill material 160 can help reduce thermal stresses on the solder structures 158 that result from a mismatch of the coefficient of thermal expansion between the surfaces of the die 110 and the solder material. In some embodiments, the underfill material 160 increases the stiffness of the device 100 to help reduce debonding between the dies 110. In some embodiments, the underfill material 160 is deposited by a capillary underfill process.

In some embodiments, one or more additional dies can be stacked on top of the first die 110a to increase the die count in the device 100. For example, as illustrated in FIG. 1, two additional dies 110 can be stacked in the device 100. In various embodiments, one additional die, two additional dies, five additional dies, ten additional dies, or any suitable number of additional dies can be added to the stack. In some embodiments, one or more additional dies can be stacked in the initial stacking process discussed above with respect to FIG. 4B. In some embodiments, once the die stack is complete, an encapsulant (not shown) can be flowed over the device 100 to further insulate and protect the dies 110. In some embodiments, once the die stack is complete, a lid (not shown) can be attached to the package substrate 102 to further insulate and/or protect the dies 110.

Figure 5A:
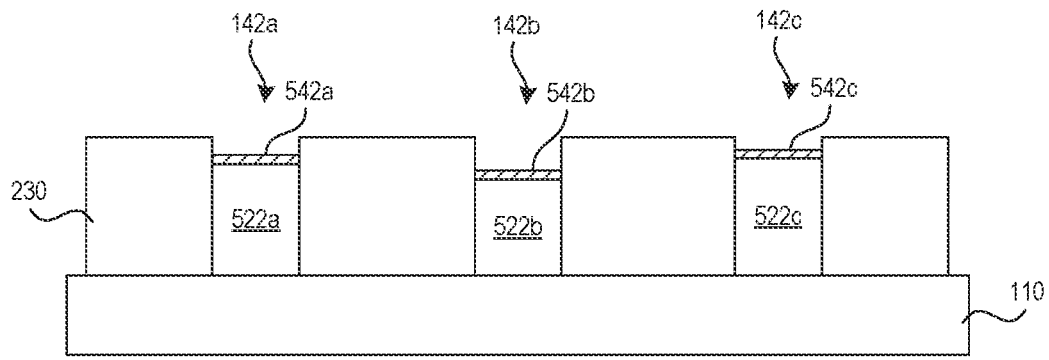
FIGS. 5A and 5B illustrate a process for leveling metallic bonding structures in accordance with some embodiments of the present technology.
Figure 5B:
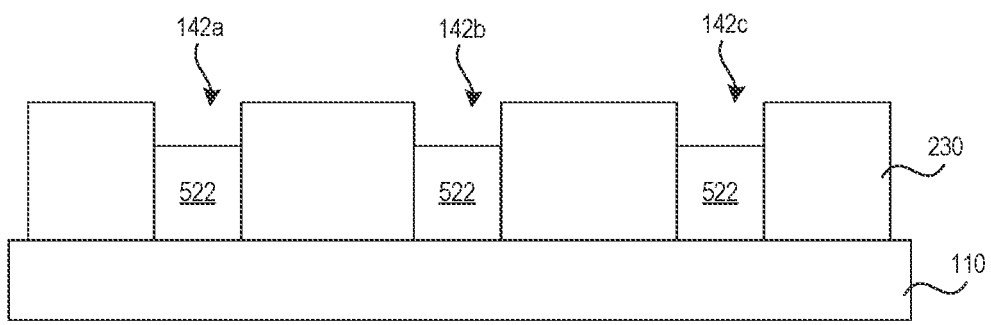

FIGS. 5A and 5B illustrate a process for leveling bonding structures 522 on a die 110 in accordance with some embodiments of the present technology. As discussed above, in some embodiments, the leveling process is used after deposition processes to improve the uniformity of the bonding structures 522. For example, the leveling process can be performed after depositing the metal plating process described above with respect to FIG. 2B, resulting in the first bond sites 122 discussed above with respect to FIG. 2C.

FIG. 5A illustrates three bonding structures 522a-c after a deposition process into vias in a second photoresist material 230. As illustrated, each of the bonding structures 522a-c can include a layer of impurities 523a-c on their respective upper surfaces. Further, each of the bonding structures 522a-c can have a different height. For example, the first bonding structure 522a is taller than the second bonding structure 522b, but shorter than the third bonding structure 522c. Without further processing, the layer of impurities 523a-c and the varying heights of the bonding structures 522 can hinder and/or prevent the bonding structures 522a-c from bonding with structures on another die.

FIG. 5B illustrates the bonding structures 522 after the leveling process. As illustrated, the layer of impurities 523 has been removed from each of the bonding structures 522. Further, each of the bonding structures 522 has had additional material removed from the upper surface to produce a generally uniform height across the bonding structures 522. That is, the leveling process includes a removal process to strip material from the bonding structures 522. The removal process can be an electrical and/or chemical process (e.g., a Durendal process, submerging the bonding structures 522 in a chemical bath, or any other suitable process) to avoid mechanical stresses on the relatively thin bonding structures. Further, the electrical and/or chemical process can allow material to be removed from the bonding structures 522 while the bonding structures 522 are supported by the second photoresist material 230. As discussed above, once the leveling process is complete, the second photoresist material 230 can be stripped from the die 110.

Figure 6:
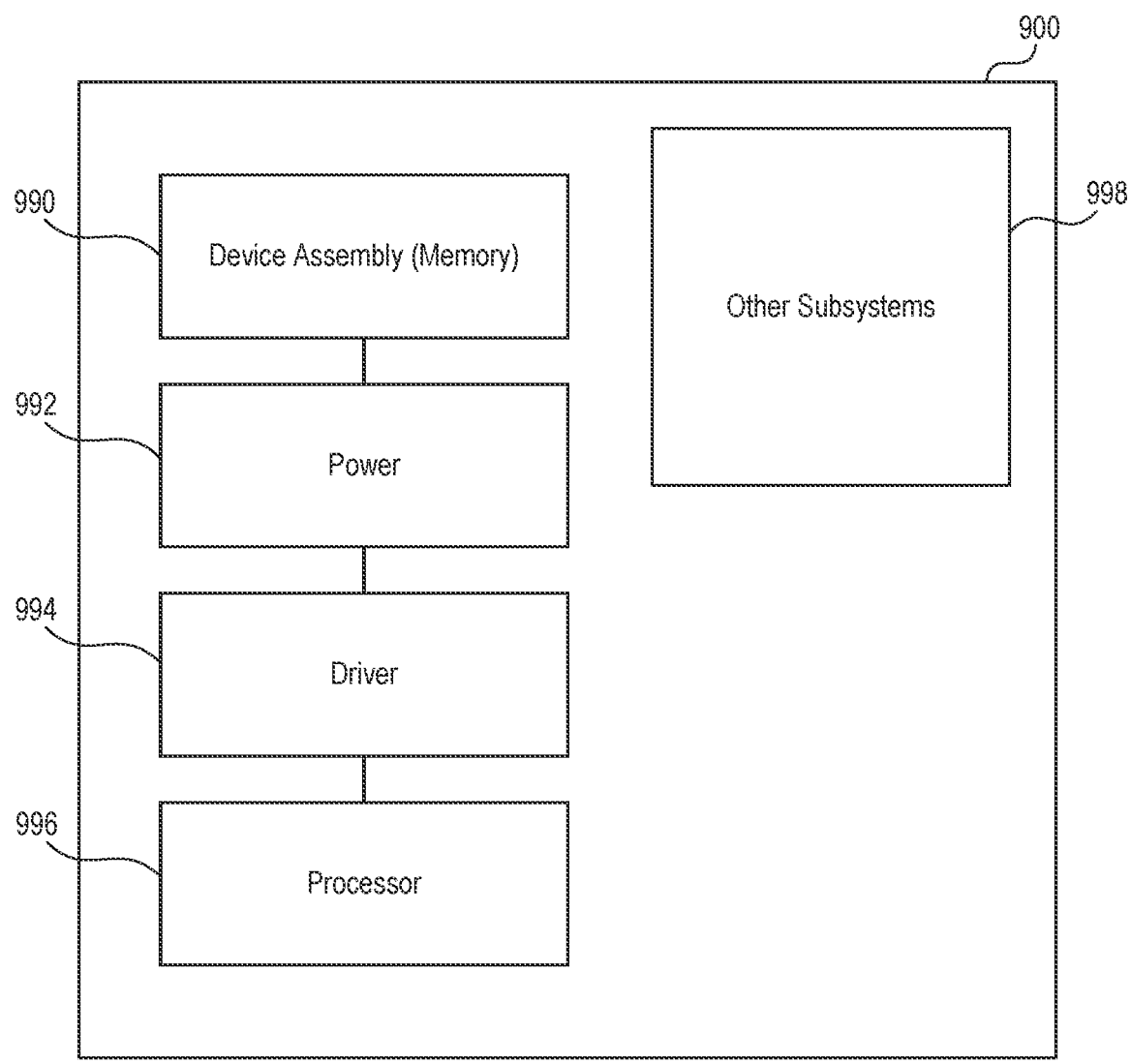
FIG. 6 is a schematic view of a system that includes a semiconductor die assembly configured in accordance with some embodiments of the present technology.

FIG. 6 is a schematic view of a system that includes a semiconductor die assembly configured in accordance with embodiments of the present technology. Any one of the semiconductor devices having the features and/or resulting from the processes described above with reference to FIGS. 1-5B can be incorporated into any of a myriad of larger and/or more complex systems, a representative example of which is system 900 shown schematically in FIG. 6. The system 900 can include a memory 990 (e.g., SRAM, DRAM, flash, and/or other memory devices), a power supply 992, a drive 994, a processor 996, and/or other subsystems or components 998. Semiconductor devices like those described above with reference to FIG. 1, or resulting from the processes described above with respect to FIGS. 2A-5B, can be included in any of the elements shown in FIG. 6. For example, the memory 990 can be include a stacked semiconductor device with hybrid metallic bonding structures such as those described above with respect to FIG.

1. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 900 include lights, cameras, vehicles, etc. With regard to these and other example, the system 900 can be housed in a single unit or distributed over multiple interconnected units, e.g., through a communication network. The components of the system 900 can accordingly include local and/or remote memory storage devices and any of a wide variety of suitable computer-readable media.

CONCLUSION

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A stacked semiconductor device, comprising:
a first semiconductor die having a first bonding surface, a plurality of first bond sites in a first array on the first bonding surface, and a plurality of second bond sites in a second array on the first bonding surface, wherein the plurality of first bond sites includes a plurality of first bond pads extending to a height, wherein each of the plurality of first bond sites is bonded to a TSV in the first semiconductor die, and wherein the plurality of second bond sites includes a plurality of second bond pads extending to the height;
a second semiconductor die having a second bonding surface facing the first bonding surface of the first semiconductor die, a plurality of third bond sites in the first array on the second bonding surface, and a plurality of fourth bond sites in the second array at the second bonding surface, wherein each of the plurality of third bond sites is bonded to a TSV in the second semiconductor die;
a plurality of solder-free interconnect structures between the first semiconductor die and the second semiconductor die, wherein each solder-free interconnect structure forms an electrical connection between an individual bond site in the plurality of first bond sites and an individual bond site in the plurality of third bond sites; and
a plurality of solder joints between the first semiconductor die and the second semiconductor die, wherein each solder joint is coupled to an individual bond site in the plurality of second bond sites and an individual bond site in the plurality of fourth bond sites.

2. The stacked semiconductor device of claim 1 wherein each solder-free interconnect structure forms a metal-metal bond between the individual bond site in the plurality of first bond sites and the individual bond site in the plurality of third bond sites.

3. The stacked semiconductor device of claim 1 wherein the electrical connection between the plurality of first bond sites and the plurality of third bond sites establish a plurality of electrical communication channels between the first semiconductor die and the second semiconductor die.

4. The stacked semiconductor device of claim 1 wherein each bond site in the plurality of second bond sites is bonded to a thermal structure in the first semiconductor die.

5. The stacked semiconductor device of claim 1 wherein the plurality of solder joints between the plurality of second bond sites and the plurality of fourth bond sites establish a plurality of thermal channels between the first semiconductor die and the second semiconductor die.

6. The stacked semiconductor device of claim 1 wherein:
the second semiconductor die has a third bonding surface opposite the second bonding surface, a plurality of fifth bond sites in the first array on the third bonding surface, and a plurality of sixth bond sites in the second array at the third bonding surface, wherein:
one or more bond sites in the plurality of fifth bond sites is electrically connected to a corresponding bond site in the plurality of third bond sites through an interconnect structure extending through the second semiconductor die, and
one or more bond sites in the plurality of sixth bond sites is thermally connected to a corresponding bond site in the plurality of fourth bond sites through a thermal structure extending through the second semiconductor die.

7. The stacked semiconductor device of claim 6, further comprising:
a third semiconductor die having a fourth bonding surface facing the third bonding surface of the second semiconductor die, a plurality of seventh bond sites in the first array on the fourth bonding surface, and a plurality of eighth bond sites in the second array at the fourth bonding surface, wherein:
  each bond site in the plurality of seventh bond sites includes a conductive structure directly bonded to a corresponding conductive structure in the plurality of fifth bond sites, and
  each bond site in the plurality of eighth bond sites includes a solder structure bonded to a corresponding conductive structure in the plurality of sixth bond sites.

8. A method for forming a stacked semiconductor device, comprising:
  forming a conductive pad on at least one first bond site of a first semiconductor die, wherein the at least one first bond site is coupled to a first TSV in the first semiconductor die;
  forming a solder structure on at least one second bond site of the first semiconductor die adjacent the at least one first bond site, wherein the at least one second bond site is coupled to a second TSV in the first semiconductor die;
  stacking the first semiconductor die on a second semiconductor die, the second semiconductor die having corresponding conductive pads individually corresponding to each of the at least one first bond site and the at least one second bond site, wherein each of the corresponding conductive pads extends to a matching height above a surface of the second die, and wherein each of the corresponding conductive pads is coupled to an individual TSV in the second die; and
  bonding the at least one first bond site and the at least one second bond site to the corresponding conductive pads on the second semiconductor die, wherein the bonding includes:
    reflowing the solder structure on the at least one second bond site to bond the at least one second bond site to the corresponding conductive pad on the second semiconductor die; and
    annealing the conductive pad to form a solder-free interconnect structure forming an electrical connection between the at least one first bond site on the first semiconductor die and the corresponding conductive pad on the second semiconductor die.

9. The method of claim 8 wherein the at least one first bond site of the first semiconductor die is at least two first bond sites, and wherein forming the conductive pads on the at least two first bond sites includes:
  disposing a photoresist material over a bonding surface of the first semiconductor die;
  patterning the photoresist material to expose the at least two first bond sites;
  depositing a conductive material into the patterned photoresist material beyond a uniform height for the conductive pads;
  removing the conductive material until each of the conductive pads is at the uniform height; and
  stripping the photoresist material from the first semiconductor die.

10. The method of claim 9 wherein the at least one second bond site of the first semiconductor die is at least two second bond sites, and wherein forming the solder structures on the at least two second bond sites includes:
  disposing a second photoresist material over the bonding surface of the first semiconductor die and the conductive pads on the at least two first bond sites;
  patterning the second photoresist material to expose the at least two second bond sites;
  depositing solder material into the second patterned photoresist material;
  stripping the second photoresist material from the first semiconductor die; and
  at least partially reflowing the solder material on the at least two second bond sites.

11. The method of claim 8 wherein the conductive pad on the at least one first bond site of the first semiconductor die and the corresponding conductive pad on the second semiconductor die are both copper pads, and wherein the annealing forms a copper-copper bond between the copper pads.

* * * * *